United States Patent
Bianco

(10) Patent No.: US 8,996,325 B2
(45) Date of Patent: Mar. 31, 2015

(54) DETECTING DEVICE OF THE CURRENT DISTRIBUTION PROFILE OF A SWITCHING CONVERTER

(75) Inventor: Alberto Bianco, Gressan (IT)

(73) Assignee: Dora S.p.A., Aosta (IT)

( * ) Notice: Subject to any disclaimer, the term of this patent is extended or adjusted under 35 U.S.C. 154(b) by 1178 days.

(21) Appl. No.: 12/942,751

(22) Filed: Nov. 9, 2010

(65) Prior Publication Data

US 2011/0112783 A1    May 12, 2011

(30) Foreign Application Priority Data

Nov. 12, 2009    (IT) .............................. MI2009A1988

(51) Int. Cl.
| | | |
|---|---|---|
| *G01R 19/00* | (2006.01) | |
| *H02M 7/538* | (2007.01) | |
| *G01R 19/257* | (2006.01) | |

(52) U.S. Cl.
CPC ............ *H02M 7/538* (2013.01); *G01R 19/257* (2013.01)
USPC ............................................. 702/64; 702/57

(58) Field of Classification Search
CPC ..... H02M 1/4225; H02M 3/156; H02M 7/00; H02M 7/003; H02M 7/30; H02M 7/42–7/44; H02M 7/538–7/53806; H02M 7/54; Y02B 70/126
USPC .......................................................... 702/64
See application file for complete search history.

(56) References Cited

U.S. PATENT DOCUMENTS

| | | | | |
|---|---|---|---|---|
| 4,219,858 A | * | 8/1980 | DePuy et al. ................... | 361/96 |
| 7,000,125 B2 | | 2/2006 | Chapuis et al. | |

OTHER PUBLICATIONS

National Semiconductor: "ADC0801/ADC0802/ADC0803/ADC804/ADC0805 8-bit µP Compatible A/D Converters", Nov. 1999, retrieved from the Internet: URL:http://www.national.com/ds.cgi/DC/ADCO801.pdf, on Jul. 14, 2010, 41 pages.
Splitz, D., "PLD adds hysteresis digitally", EDN Electrical Design News, Reed Business Information 35, No. 13, (Jun. 21, 1990): 265-266.

* cited by examiner

*Primary Examiner* — Mischita Henson
(74) *Attorney, Agent, or Firm* — Seed IP Law Group PLLC

(57) ABSTRACT

There is described a detecting device of the distribution profile of current of a switching converter; the converter has an input voltage and is adapted to supply an output current. The device comprises means adapted to convert a signal indicating the output current of the converter into a digital signal comprising p digital samples, being p an integer, processed in p successive time intervals belonging to a time period. The detecting device comprises further means adapted to process each sample of the plurality of samples by comparing each sample with a respective plurality of n reference currents, being n an integer, having a value successively increasing from the first to the last and associated with a plurality of n counters, and by supplying a single i-th counter of said plurality of counters, being i an integer between 1 and n, said supplying occurring if the sample has a higher value than the i-th reference current, but lower than the i+1-th reference current; said further means are adapted to process all p samples.

20 Claims, 4 Drawing Sheets

| |
|---|
| 13 |
| 0 |
| 0 |
| 2 |
| 6 |
| 6 |
| 4 |
| 2 |

Fig.5

DETECTING DEVICE OF THE CURRENT DISTRIBUTION PROFILE OF A SWITCHING CONVERTER

BACKGROUND

1. Technical Field

The present disclosure relates to a detecting device of the current distribution profile of a switching converter.

2. Description of the Related Art

One of the main parameters for optimizing the efficiency of a switching converter is the load current supplied the converter to one or more loads. If the load current is known, the converter may be optimized for obtaining the maximum efficiency at the best load current.

However, a prior knowledge of the load current is a problem for the present switching converters. Indeed, the current absorbed by a microprocessor is difficult to predict, for example. Using information from the loading devices may improve the knowledge of the load current and allow a better optimization of the converter.

Another important information is represented by the load current distribution, e.g., the percentage of time during which the load current falls within a particular interval.

The known art solutions allow a user or a remote system to read the load current of a switching converter; however, the calculation of the current distribution involves several readings.

U.S. Pat. No. 7,000,125 describes a method for monitoring the parameters of a converter load point and the load current by a serial interface. The patent describes a control system comprising a plurality of Point of Load (POL) regulators, a serial bus operatively connected to POL regulators and a control device connected to the serial bus and adapted to send and receive digital data to and from the plurality of POL regulators.

BRIEF SUMMARY

In one embodiment, a detecting device is provided of the current distribution profile of a switching converter, which is different from the known ones. Preferably, said detecting device is integrated with the control device of the switching converter.

In one embodiment, a detecting device is provided of the current distribution profile of a switching converter, said converter having an input voltage and being adapted to provide an output current, said device comprising means adapted to convert a signal indicating the output current of the converter into a digital signal comprising p digital samples, being p an integer, processed in p successive time intervals belonging to a time period, characterized in that it comprises further means adapted to process each sample of the plurality of samples by comparing each sample with a respective plurality of n reference currents, being n an integer, having a successively increasing value from the first to the last, and associated with a plurality of n counters, and by supplying a single i-th counter of said plurality of counters, being i an integer between 1 and n, said supplying occurring if the sample has a higher value than the i-th reference current, but lower than the i+1-th reference current, said further means being adapted to process all p samples.

Said device preferably comprises other means adapted to process the output current distribution profile of the converter according to the values of the single counters.

BRIEF DESCRIPTION OF THE SEVERAL VIEWS OF THE DRAWINGS

The features and advantages of the embodiments described herein will become more apparent from the following detailed description of a practical embodiment thereof, shown by way of non-limiting example in the accompanying drawings, in which:

FIG. 5 shows a data packet DATA processed in response to the current distribution profile in FIG. 4.

DETAILED DESCRIPTION

Figure 1:
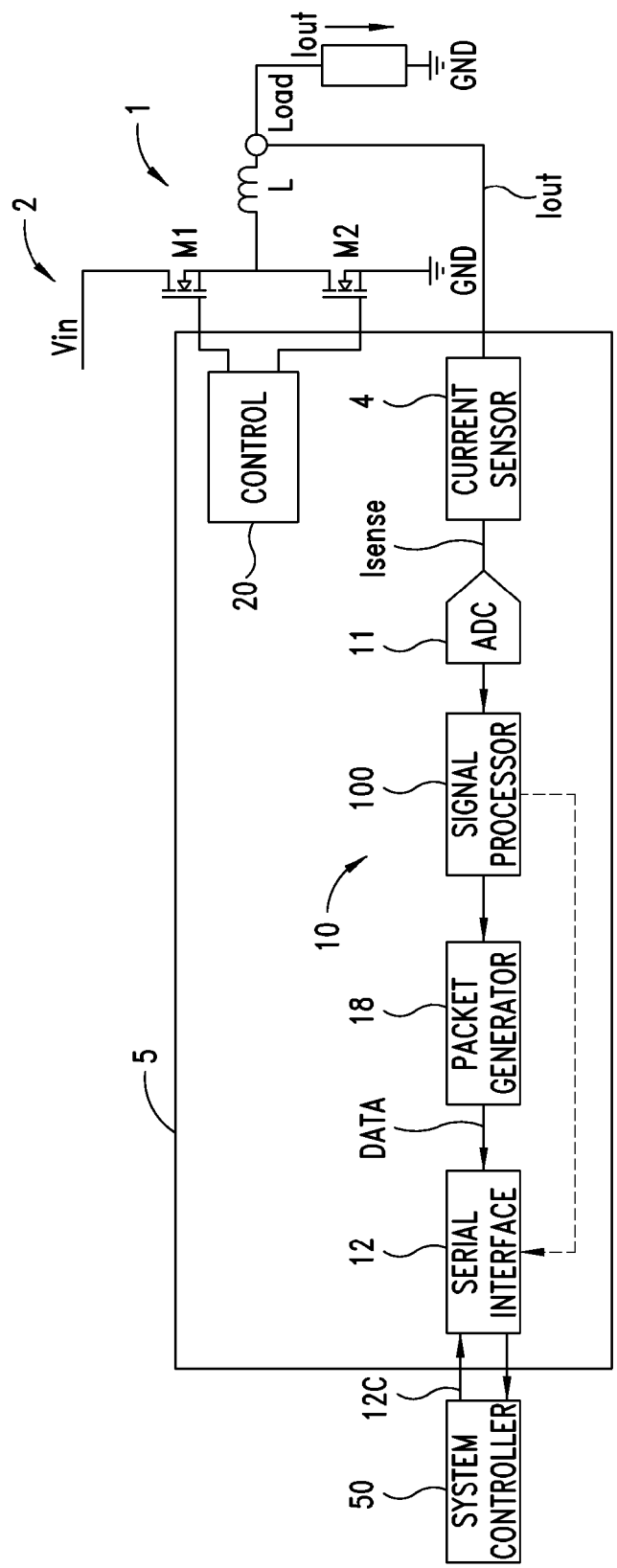
FIG. 1 is a diagram of the detecting device of the current distribution profile of a switching converter in accordance with an embodiment.

FIG. 1 shows a diagram of an integrated circuit 5 that includes a detecting device 10 of the current distribution profile of a switching converter in accordance with an embodiment. FIG. 1 shows a switching converter, preferably a DC-DC converter 1, comprising an half bridge 2 of transistors comprising transistors M1 and M2 arranged between the input voltage Vin and the ground GND. The central point of the half bridge 2 is connected to a series of an inductor L and a load LOAD connected to ground GND; an output current Iout flows on the load LOAD. The transistors M1 and M2 are controlled by a control device 20.

The detecting device 10 comprises an analog-to-digital converter 11 having an input signal Isense indicating the output current Iout, preferably indicating the current which circulates in the inductor L, and adapted to convert said signal into a digital signal Id. The signal Isense may be provided by a circuit 4 inside the detecting device 10.

The digital signal Id is at the input of a signal processor device 100 adapted to calculate the current distribution profile according to the digital signal Id. The digital signal Id comprises p samples, being p an integer, produced at the time instants t1, t2 ... tn into which the time period T is divided, in which time period the calculation of the distribution profile of current Iout is desired; the time instants t1, t2 ... tn are consecutive to one another and preferably at time intervals Dt which are equal to one another.

Figure 2:
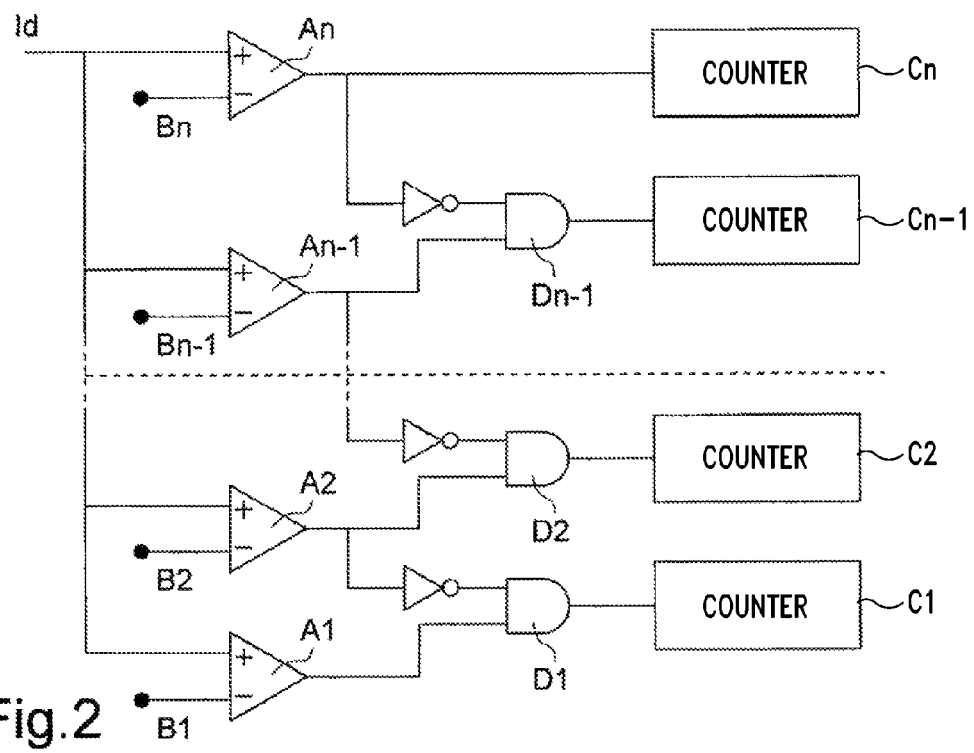
FIG. 2 is a more detailed diagram of the detecting device in FIG. 1.

Said device 100, seen in FIG. 2, comprises a plurality of digital comparators A1 ... An adapted to compare the digital signal Id with a plurality of reference currents or thresholds B1 ... Bn and to supply a single counter of a plurality of counters C1 ... Cn if the digital signal Id exceeded the i-th threshold but is lower than the i+1-th threshold (being i an integer between 1 and n), i.e., if the signal Id has a higher value than the threshold Bn−2, the corresponding comparator An−2 will supply the counter Cn−2, and the other counters will not be supplied.

Namely, the digital comparators A1 ... An are adapted to compare each sample of the digital signal Id with a plurality of reference currents or thresholds B1 ... Bn and to supply a single counter of a plurality of counters C1 ... Cn if the sample under examination has a higher value than the i-th threshold but lower than the i+1-th threshold, i.e., if the sample under examination has a higher value than the threshold Bn−2, the corresponding comparator An−2 will supply the counter Cn−2, and the other counters will not be supplied, for example. Said process of comparing and supplying a single counter among the counters C1 ... Cn is carried out for each sample of the digital signal Id; at the end of the process the counters C1 ... Cn will give the distribution profile of current Iout.

The values of each counter C1 ... Cn are preferably sent to a handling block 18 adapted to derive the distribution profile of current Iout according to said values and to form a data packet DATA containing said profile to be sent to the serial interface 12; an external device 50 may read the data packet DATA through the serial interface 12.

The reading of the distribution profile of current Iout may be preferably obtained by a single transaction, i.e., the interface 12 is designed such that, by receiving a single command 12C from the external device 50, it allows to read a single data packet containing the current distribution profile.

Alternatively, the external device 50 may directly read the values of the counters C1 ... Cn using the serial interface 12 and derive the distribution profile of current Iout.

The distribution profile of current Iout in a time period T may be calculated by dividing the value of each counter Ci by the sum of the values of all counters C1 ... Cn.

The digital comparators A1 ... An have 1 or 0 outputs.

The detecting device preferably comprises a plurality of gates AND D1 ... Dn−1, each having an output of a comparator A1 ... An−1 and the denied output of the next comparator A2 ... An at the input, i.e., a gate AND Di has the output of comparator Ai and the denied output of comparator Ai+1 at the input for i=1 ... n−1; thereby, when the signal Id exceeds the threshold Bi but is lower than the threshold Bi−1, the counter Ci will be supplied, whereas if Id is higher than the threshold Bi−1, the gate AND will have the output 1 of the comparator Ai and the denied output 0 of the comparator Bi−1 at the input, and will not supply counter Ci. The output of comparator An supplies counter Cn.

The detecting device 10 of the current distribution profile is preferably integrated with the control device 20 of the half bridge of transistors M1 and M2 in a single semiconductor chip, e.g., silicon.

Figure 3:
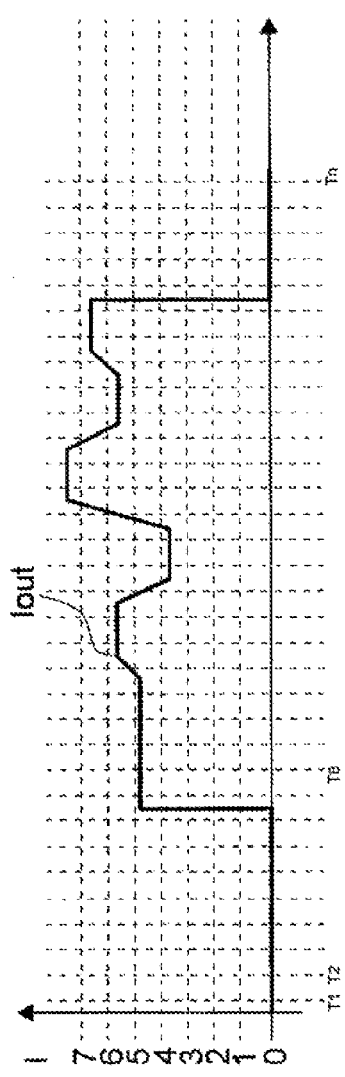
FIG. 3 shows the output current of a switching converter.

FIG. 3 shows the pattern of the consumption of current Iout in a switching converter over a time period T. For obtaining the current distribution profile, seen in FIG. 4, the circuit 4 having the current Iout at the input, supplies the analog-to-digital converter 11 with the current Isense which is proportional to the current Iout. The current Isense is sampled in the successive instants t1 ... In spaced out by the time interval Dt at 10 Ksps into an input signal Id of the detecting device 10. Each sample of the signal Id is compared with each current threshold B1 ... Bn, being n=7, and in which B1=1 A, B2=2 A ... B7=7 A, by the respective comparators A1 ... A7 and a single counter from the counters C1 ... C7 will be supplied. At the instant t1, for example, the current Iout=0 and the counter C1 will be supplied; at the instant t2 the current Iout=0 and the counter C1 will be still supplied; at the instant t8 the current Iout has a value from 4 A to 5 A and only the counter C4 will be supplied and so on.

Figure 4:
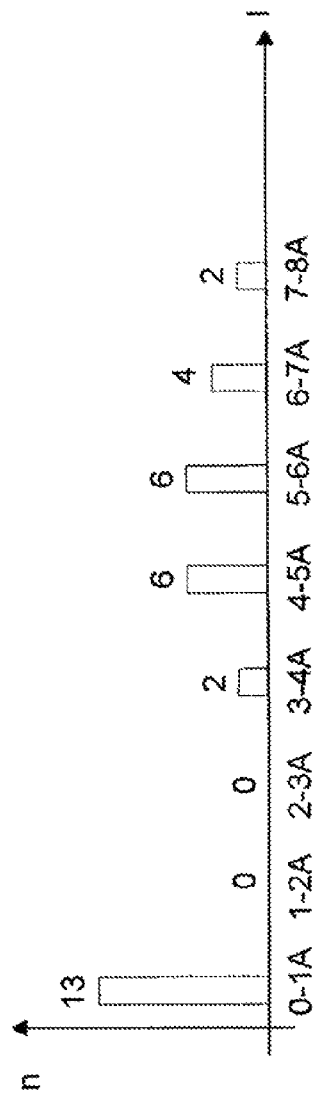
FIG. 4 shows the current distribution profile in FIG. 3.
Figure 5:
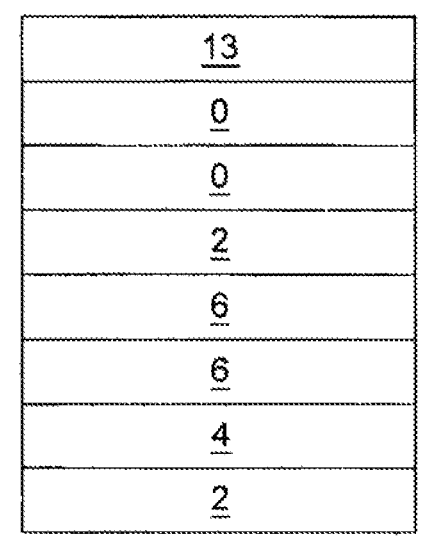

FIG. 5 shows a data packet DATA processed in response to the current distribution profile in FIG. 4. The data packet DATA generated by the device 18 may be read through the interface 12 by the external device 50.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A detecting device for detecting a distribution profile of an output current of a switching converter configured to supply the output current, said detecting device comprising:
   a signal converter configured to convert a signal indicating the output current of the switching converter into a digital signal comprising a plurality of digital samples, and to process the digital samples into successive time intervals belonging to a time period; and
   a signal processor operably coupled to the signal converter, and configured to process each sample of the plurality of samples by comparing the sample with a plurality of n reference currents, n being an integer, the plurality of n reference currents having values successively increasing from a first reference current of the plurality of n reference currents to a last reference current of the plurality of n reference currents, the signal processor including a plurality of n counters associated respectively with the plurality of n reference currents, the signal processor being further configured to process each sample of the plurality of samples by incrementing a single i-th counter of said plurality of n counters for each sample of the plurality of samples, i being an integer between 1 and n, if the sample has a higher value than an i-th reference current of the plurality of n reference currents but lower than an i+1-th reference current of the plurality of n reference currents.

2. The device of claim 1, wherein the signal processor includes:
   n comparators;
   n−1 AND gates coupled to respective outputs of n−1 comparators of the n comparators, wherein an i-th AND gate of the n−1 AND gates, is also coupled to a denied output of an i+1-th comparator of the n comparators;
   n−1 counters coupled to respective outputs of the n−1 AND gates; and
   an i-th counter, of the plurality of n counters, coupled to a respective output of an i-th comparator of the n comparators.

3. The device of claim 1, further comprising a serial interface in communication with the plurality of n counters, and configured to transmit values of the plurality of n counters to an external device.

4. The device of claim 1, further comprising a distribution profile handler configured to process the distribution profile of the output current of the switching converter according to values of the plurality of n counters.

5. The device of claim 4, wherein said distribution profile handler is configured to process the distribution profile of the output current of the switching converter by dividing each value of the single i-th counter by a sum of the values of the plurality of n counters.

6. The device of claim 4, wherein said distribution profile handler is configured to form a data packet according to the processed distribution profile of the output current.

7. The device of claim 6, further comprising a serial interface operably coupled to the distribution profile handler, said serial interface configured to transmit said data packet to an external device and to send said data packet in response to a command from the external device.

8. The device of claim 1, wherein the successive time intervals are equal to one another.

9. An integrated control circuit of a switching converter comprising:
- a detecting device for detecting a distribution profile of an output current of a switching converter configured to supply the output current, said detecting device comprising:
  - a signal converter configured to convert a signal indicating the output current of the switching converter into a digital signal comprising a plurality of digital samples, and to process the digital samples into successive time intervals belonging to a time period; and
  - a signal processor operably coupled to the signal converter, and configured to process each sample of the plurality of samples by comparing the sample with a plurality of n reference currents, n being an integer, the plurality of n reference currents having values successively increasing from a first reference current of the plurality of n reference currents to a last reference current of the plurality of n reference currents, the signal processor including a plurality of n counters associated respectively with the plurality of n reference currents, the signal processor being further configured to process each sample of the plurality of samples by incrementing a single i-th counter of said plurality of n counters for each sample of the plurality of samples, i being an integer between 1 and n, if the sample has a higher value than an i-th reference current of the plurality of n reference currents but lower than an i+1-th reference current of the plurality of n reference currents.

10. The integrated control circuit of claim 9, wherein the signal processor includes:
- n comparators;
- n−1 AND gates coupled to respective outputs of n−1 comparators of the n comparators, wherein an i-th AND gate of the n−1 AND gates, is also coupled to a denied output of an i+1-th comparator of the n comparators;
- n−1 counters coupled to respective outputs of the n−1 AND gates; and
- an i-th counter, of the plurality of n counters coupled to a respective output of an i-th comparator of the n comparators.

11. The integrated control circuit of claim 9, further comprising a serial interface in communication with the plurality of n counters, and configured to transmit values of the plurality of n counters to an external device.

12. The integrated control circuit of claim 9, further comprising a distribution profile handler configured to process the distribution profile of the output current of the switching converter according to values of the plurality of n counters.

13. A method comprising:
- detecting a distribution profile of an output current of a switching converter configured to supply the output current, said detecting comprising:
  - converting a signal indicating the output current of the switching converter into a digital signal comprising a plurality of digital samples, and to process the digital samples into successive time intervals belonging to a time period; and
  - processing each sample of the plurality of samples by comparing the sample with a plurality of n reference currents, n being an integer, the plurality of n reference currents having values successively increasing from a first reference current of the plurality of n reference currents to a last reference current of the plurality of n reference currents, the signal processor including a plurality of n counters associated respectively with the plurality of n reference currents; and
  - processing each sample of the plurality of samples further by incrementing a single i-th counter of said plurality of n counters for each sample of the plurality of samples, i being an integer between 1 and n, if the sample has a higher value than an i-th reference current of the plurality of n reference currents but lower than an i+1-th reference current of the plurality of n reference currents.

14. The method of claim 13, wherein the comparing comprises:
- communicating outputs of n−1 comparators of n comparators to inputs of n−1 AND gates, wherein an i-th AND gate of the n−1 AND gates, is also coupled to a denied output of an i+1-th comparator of the n comparators;
- communicating outputs of the n−1 AND gates to n−1 counters; and
- communicating a respective output of an i-th comparator of the n comparators to an i-th counter of the plurality of counters.

15. The method of claim 13, further comprising transmitting values of the plurality of n counters to an external device.

16. The method of claim 13, further comprising processing the distribution profile of the output current of the switching converter according to values of the plurality of n counters.

17. The method of claim 16, further comprising processing the distribution profile of the output current of the switching converter by dividing each value of the single i-th counter by a sum of the values of the plurality of n counters.

18. The method of claim 16, further comprising forming a data packet according to the processed distribution profile of the output current.

19. The method of claim 18, further comprising transmitting said data packet to an external device in response to a command from the external device.

20. The method of claim 13, wherein the successive time intervals are equal to one another.

* * * * *